(12) United States Patent
Chetanneau et al.

(10) Patent No.: US 12,020,844 B2
(45) Date of Patent: Jun. 25, 2024

(54) MEASUREMENT TRANSFORMER INCLUDING A PRINTED CIRCUIT BOARD

(71) Applicant: SAFRAN ELECTRONICS & DEFENSE, Paris (FR)

(72) Inventors: Patrice Chetanneau, Paris (FR); François Guillot, Paris (FR)

(73) Assignee: SAFRAN ELECTRONICS & DEFENSE, Paris (FR)

( * ) Notice: Subject to any disclaimer, the term of this patent is extended or adjusted under 35 U.S.C. 154(b) by 650 days.

(21) Appl. No.: 17/252,605

(22) PCT Filed: Jun. 26, 2019

(86) PCT No.: PCT/EP2019/067081
§ 371 (c)(1),
(2) Date: Dec. 15, 2020

(87) PCT Pub. No.: WO2020/002475
PCT Pub. Date: Jan. 2, 2020

(65) Prior Publication Data
US 2021/0257146 A1    Aug. 19, 2021

(30) Foreign Application Priority Data
Jun. 27, 2018   (FR) ..................................... 18 55758

(51) Int. Cl.
*H01F 27/28*   (2006.01)
*H01F 1/34*    (2006.01)
(Continued)

(52) U.S. Cl.
CPC ......... *H01F 27/2804* (2013.01); *H01F 1/344* (2013.01); *H01F 27/255* (2013.01); *H01F 41/0246* (2013.01); *H01F 2027/2809* (2013.01)

(58) Field of Classification Search
CPC .. H01F 27/2804; H01F 27/2895; H01F 19/08; H01F 2019/085; H01F 2027/2809;
(Continued)

(56) References Cited

U.S. PATENT DOCUMENTS 4,536,733 A * 8/1985 Shelly .................... H05K 1/165
                                                     336/200
5,425,166 A * 6/1995 Hastings ............... H01F 1/0027
                                                     336/200
(Continued)

FOREIGN PATENT DOCUMENTS

CN     105632893 A    6/2016
DE     102016119164 A1  4/2018
(Continued)

*Primary Examiner* — Shawki S Ismail
*Assistant Examiner* — Matthew T Sarles
(74) *Attorney, Agent, or Firm* — Muncy, Geissler, Olds & Lowe, P.C.

(57) ABSTRACT

A measurement transformer includes a printed circuit and a magnetic core. The printed circuit includes an insulating layer, a primary through assembly and a secondary through assembly. The primary through assembly includes first primary plated through holes and second primary plated through holes extending through the insulating layer. The primary through assembly forms a portion of a primary winding of the transformer. The primary winding has a single turn. The secondary through assembly includes first secondary plated through holes and second secondary plated through holes extending through the insulating layer. The secondary through assembly forms a portion of a secondary winding of the transformer. The secondary winding includes a plurality of turns connected in series. The magnetic core extends in the thickness of the printed circuit.

8 Claims, 3 Drawing Sheets

(51) Int. Cl.
*H01F 27/255* (2006.01)
*H01F 41/02* (2006.01)

(58) Field of Classification Search
CPC .... H01F 27/24; H01F 27/2823; H01F 27/292; H01F 27/324; H01F 27/40; H01F 38/42; H01F 17/06; H01F 17/062; H01F 2017/067; H01F 30/16; H01F 41/08; H01F 27/42; H01F 24/427; H01F 38/28; H01F 38/30; H01F 2038/305
See application file for complete search history.

(56) References Cited

U.S. PATENT DOCUMENTS

| | | | | |
|---|---|---|---|---|
| 6,558,188 | B1* | 5/2003 | Mantey | H01R 12/716 439/499 |
| 8,643,314 | B2* | 2/2014 | Touchi | H05H 7/02 315/504 |
| 9,818,527 | B2* | 11/2017 | Zabaco | H01F 27/2804 |
| 2007/0257761 | A1* | 11/2007 | Mano | H01F 17/06 336/200 |
| 2013/0057267 | A1* | 3/2013 | Klein | H05K 1/165 324/234 |
| 2014/0191829 | A1* | 7/2014 | Chiba | H01F 5/00 29/602.1 |
| 2014/0198463 | A1* | 7/2014 | Klein | G01R 33/04 174/257 |
| 2015/0213946 | A1* | 7/2015 | Mano | H01F 17/04 336/200 |
| 2016/0278200 | A1* | 9/2016 | Costes | H05K 1/185 |
| 2017/0110233 | A1* | 4/2017 | Sakai | H01F 3/10 |
| 2017/0154726 | A1* | 6/2017 | Prager | H01F 27/24 |
| 2017/0222563 | A1* | 8/2017 | Noma | H01F 27/40 |
| 2018/0315543 | A1* | 11/2018 | Otsubo | H01F 17/0033 |
| 2021/0141002 | A1* | 5/2021 | Chetanneau | G01R 15/185 |
| 2021/0255222 | A1* | 8/2021 | Chetanneau | G01R 33/04 |
| 2021/0257146 | A1* | 8/2021 | Chetanneau | H01F 27/255 |
| 2022/0093534 | A1* | 3/2022 | Duong | H01F 27/24 |
| 2022/0252642 | A1* | 8/2022 | Kulkarni | G01R 19/0092 |
| 2023/0090759 | A1* | 3/2023 | Pietambaram | H05K 1/165 257/678 |

FOREIGN PATENT DOCUMENTS

| | | | | |
|---|---|---|---|---|
| JP | | 2015070367 A | | 4/2015 |
| KR | | 20170040777 A | * | 4/2017 ......... H01F 41/0233 |

* cited by examiner

MEASUREMENT TRANSFORMER INCLUDING A PRINTED CIRCUIT BOARD

The invention relates to the field of measurement transformers comprising a printed circuit.

BACKGROUND OF THE INVENTION

Figure 1:
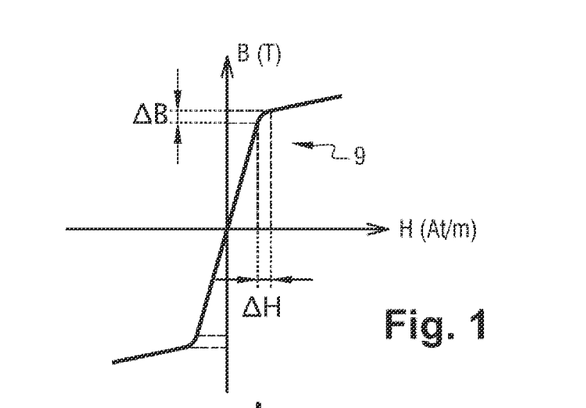
FIG. 1 plots the curve of a transfer function between a magnetic field and a magnetic flux density.

A flux gate current sensor makes use of the property of a magnetic material forming a magnetic core whereby it saturates from a certain level of magnetic excitation. With reference to FIG. 1, for an increasing magnetic field H, the slope of the transfer function between magnetic field H and magnetic flux density B decreases greatly from a so-called "saturation" value of the magnetic core. The saturation value, in FIG. 1, corresponds to the ranges ΔH and ΔB.

Figure 2:
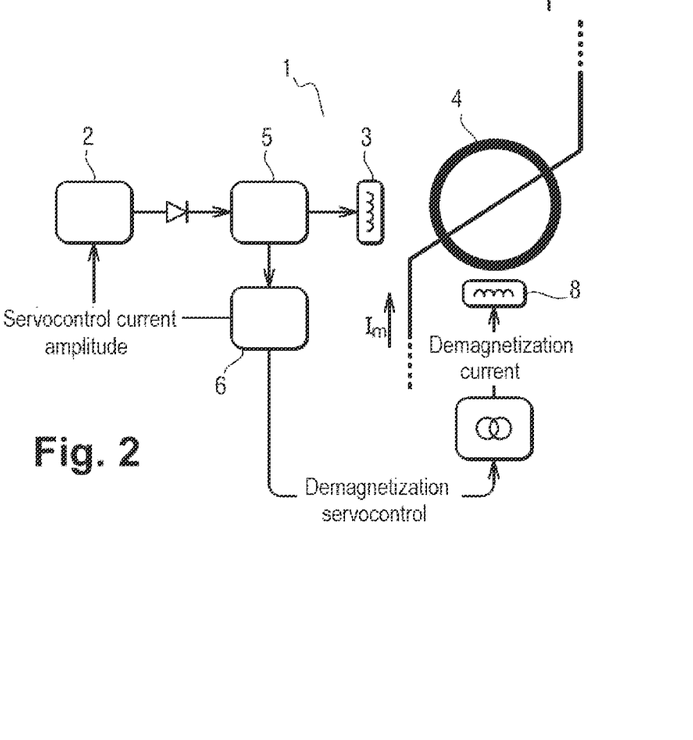
FIG. 2 shows an existing flux gate current sensor.
Figure 3:
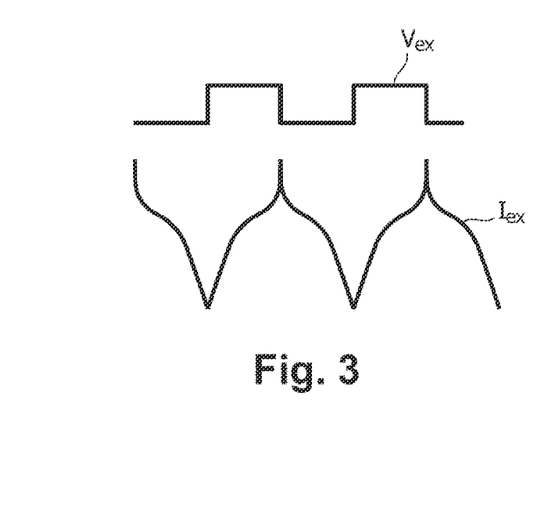
FIG. 3 shows the curve for an excitation voltage and the curve for an excitation current that excite a magnetic core of the existing flux gate current sensor.

With reference to FIGS. 2 and 3, in a conventional flux gate current sensor 1 for measuring a current Im flowing in a conductor, a square wave signal generator 2 applies a square wave excitation voltage Vex to the terminals of an excitation winding 3 wound around a magnetic core 4. The excitation current Iex flowing in the excitation winding 3 is measured by a measurement module 5. A peak detector 6 connected to the measurement module 5 supplies two items of information: the saturation level and the difference between the peak currents of the excitation current Iex. The saturation level serves to servocontrol the amplitude of the excitation voltage Vex. The difference between the peak currents of the excitation current Iex serves to estimate the current Im that is to be measured, and it acts via a voltage-to-current converter 7 to servocontrol the amplitude of a demagnetization current that flows in a demagnetization winding 8 and that serves to compensate the magnetic flux produced in the magnetic core 4 by the current Im that is to be measured.

Flux gate current sensors are preferred in certain applications. This applies in particular to measuring a current flowing in a cut-off member of the solid-state power controller (SSPC) type for user equipment, or else to measuring a current flowing in an energy converter member of the power electronic module (PEM) type connected to a phase of a motor.

OBJECT OF THE INVENTION

An object of the invention is to improve the industrial reproducibility and to reduce the cost of a flux gate current sensor.

SUMMARY OF THE INVENTION

In order to achieve this object, there is provided a measurement transformer comprising a printed circuit and a magnetic core, the printed circuit including an insulating layer, a primary through assembly comprising first primary plated through holes and second primary plated through holes extending through the insulating layer, the primary through assembly forming a portion of a primary winding of the measurement transformer, said primary winding having a single turn, the printed circuit further including a secondary through assembly comprising first secondary plated through holes and second secondary plated through holes extending through the insulating layer, the secondary through assembly forming a portion of a secondary winding of the measurement transformer, said secondary winding comprising a plurality of turns connected in series, the magnetic core extending in the thickness of the printed circuit.

The electrical characteristics of the primary plated through holes and of the secondary plated through holes of the printed circuit are perfectly reproducible. Furthermore, by incorporating the magnetic core of the measurement transformer of the invention in the thickness of the printed circuit, the material used for making it, its structure, and thus its characteristics are well mastered.

Furthermore, the measurement transformer of the invention is inexpensive since it is made up of a printed circuit, plated through holes, and a magnetic core that is incorporated directly in the printed circuit.

Thus, by incorporating the measurement transformer of the invention in a flux gate current sensor, the industrial reproducibility and the cost of said flux gate current sensor are improved.

The invention can be better understood in the light of the following description of a particular, nonlimiting embodiment of the invention.

BRIEF DESCRIPTION OF THE DRAWINGS

Reference is made to the accompanying drawings, in which.

DETAILED DESCRIPTION OF THE INVENTION

Figure 4:
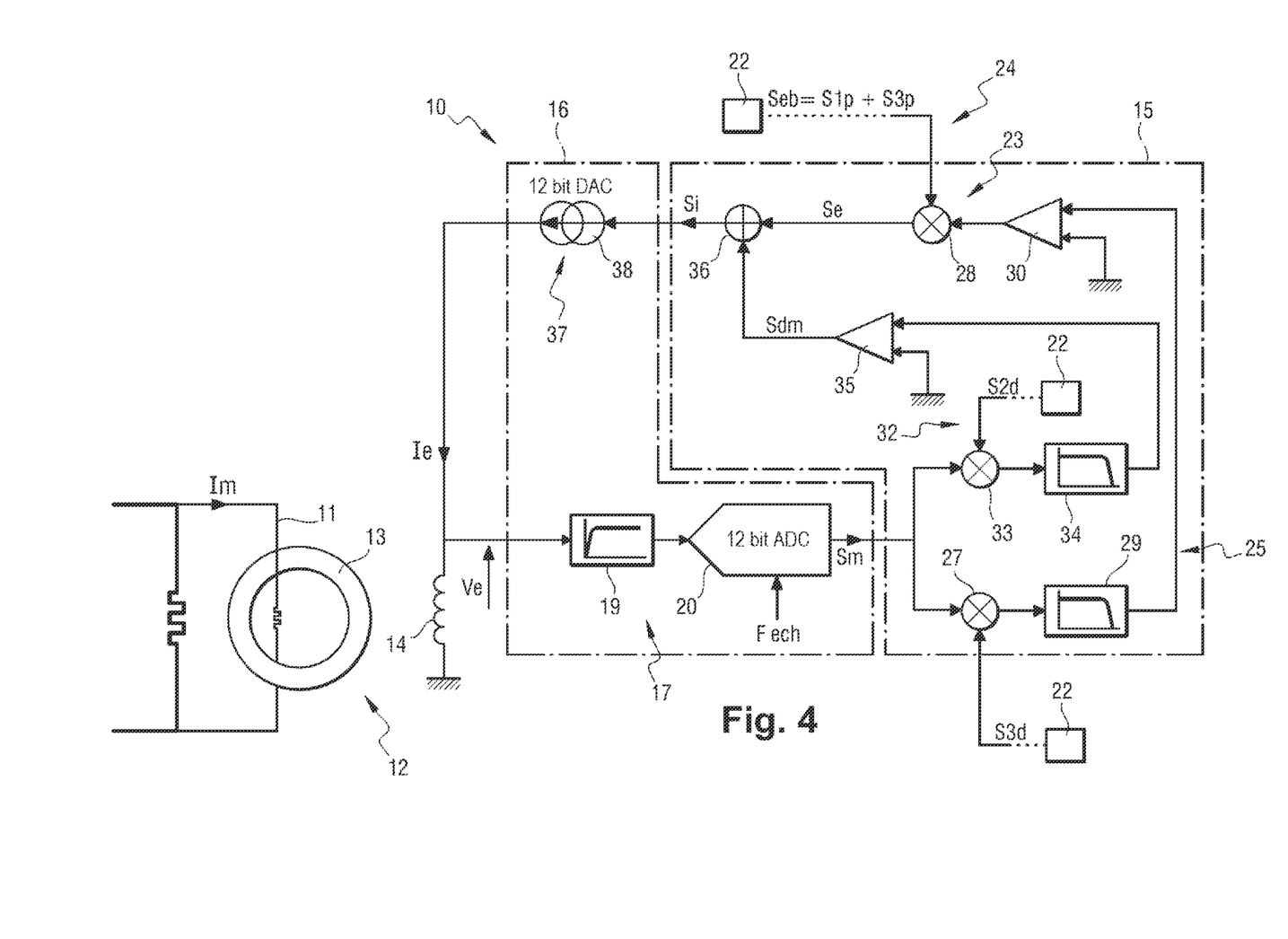
FIG. 4 shows a novel flux gate current sensor including a transformer of the invention.

With reference to FIG. 4, a flux gate current sensor 10 is used in this example to measure a current Im that is to be measured and that flows in a conductor 11.

The flux gate current sensor 10 includes a measurement transformer 12 of the invention comprising a magnetic core 13, a primary winding, and a secondary winding. The primary winding is the conductor 11. The magnetic core 13 extends around the conductor 11. The secondary winding is a measurement winding 14 wound around the magnetic core 13.

The flux gate current sensor 10 includes a plurality of electronic components forming a digital portion 15 and an analog portion 16.

The digital portion 15 includes a digital processor component, which is specifically a field programmable gate array (FPGA), but that could be some other component: a microcontroller, a processor, an application-specific integrated circuit (ASIC), etc.

The flux gate current sensor 10 further comprises an acquisition circuit 17. The acquisition circuit 17 forms part of the analog portion 16.

The acquisition circuit 17 is connected to the measurement winding 14.

The acquisition circuit 17 comprises a highpass filter 19 and an analog-to-digital converter (ADC) 20 connected to an output of the highpass filter 19.

In this example, the ADC 20 is a 12-bit converter having its operation clocked at a frequency Fech. In this example Fech=100 megahertz (MHz). The ADC 20 could naturally present characteristics that are different.

The acquisition circuit 17 acquires an analog measurement voltage Ve from the terminals of the measurement winding 14. The measurement voltage Ve is applied as input to the highpass filter 19.

The resulting voltage is applied as input to the ADC 20, which produces a digital measurement signal Sm.

The flux gate current sensor 10 includes a high frequency generator 22. The high frequency generator 22 is incorporated in the FPGA (where the term "incorporated" could be replaced by any of the following terms: programmed, implemented, provided, etc.)

The high frequency generator 22 produces a digital reference signal of frequency f0, a digital reference signal of frequency 2·f0, and a digital reference signal of frequency 3·f0.

In this example, the digital reference signal of frequency f0 is of the form:

$$S1r = \sin(\omega 0 t).$$

In this example, the digital reference signal of frequency 2·f0 is of the form:

$$S2r = \cos(2 \cdot \omega 0 t).$$

In this example, the digital reference signal of frequency 3·f0 is of the form:

$$S3r = \sin(3 \cdot \omega 0 t).$$

The flux gate current sensor 10 further comprises an excitation circuit 23. The excitation circuit 23 is implemented in the FPGA.

The excitation circuit 23 is connected to the high frequency generator 22.

The excitation circuit 23 comprises a raw excitation circuit 24 and an excitation servocontrol circuit 25.

The raw excitation circuit 24 receives the digital reference signal of frequency f0 and the digital reference signal of frequency 3·f0, and from these signals it produces a partial digital excitation signal of frequency f0 and a partial digital excitation signal of frequency 3·f0.

In this example, the partial digital excitation signal of frequency f0 is of the form:

$$S1p = k1 \cdot \sin(\omega 0 t).$$

In this example, the partial digital excitation signal of frequency 3·f0 is of the form:

$$S3p = k2 \cdot \sin(3 \cdot \omega 0 t).$$

The raw excitation circuit 24 adds together the partial digital excitation signal of frequency f0 and the partial digital excitation signal of frequency 3·f0 in order to generate a raw digital excitation signal. The raw digital excitation signal is of the form:

$$Seb = S1p + S3p = k1 \cdot \sin(\omega 0 t) + k2 \cdot \sin(3 \omega 0 t).$$

The excitation servocontrol circuit 25 is connected to the high frequency generator 22.

The excitation servocontrol circuit 25 receives the digital reference signal of frequency 3·f0, and from this digital reference signal of reference 3·f0, it produces a digital demodulation signal of frequency 3·f0.

In this example, the digital demodulation signal of frequency 3·f0 is of the form:

$$S3d = k3 \cdot \sin(3 \cdot \omega 0 t).$$

The excitation servocontrol circuit 25 includes a first multiplier 27, a second multiplier 28, an integrator 29, and a first amplifier 30. The first amplifier 30 is connected to an output of the integrator 29.

The first multiplier 27 multiplies the digital measurement signal Sm by the digital demodulation signal of frequency 3·f0. The resulting signal is applied as input to the integrator 29.

It should be observed that the first multiplier 27 and the integrator 29 act as a first synchronous demodulator.

The first amplifier 30 thus produces a digital error signal. The second multiplier 28 multiplies the raw digital excitation signal Seb by the digital error signal to obtain a digital excitation signal. The digital excitation signal is of the form:

$$Se = k0 \cdot (k1 \cdot \sin(\omega 0 t) + k2 \cdot \sin(3 \omega 0 t)).$$

The flux gate current sensor 10 further comprises a demagnetization servocontrol circuit 32. The demagnetization servocontrol circuit 32 is incorporated in the FPGA.

The demagnetization servocontrol circuit 32 is connected to the high frequency generator 22.

The demagnetization servocontrol circuit 32 receives the digital reference signal of frequency 2·f0, and from this digital reference signal of frequency 2·f0, it produces a digital demodulation signal of frequency 2·f0.

In this example, the digital demodulation signal of frequency 2·f0 is of the form:

$$S2d = k4 \cdot \cos(2 \cdot \omega 0 t).$$

The demagnetization servocontrol circuit 32 includes a third multiplier 33, a lowpass filter 34, and a second amplifier 35. The second amplifier 35 is connected to an output of the lowpass filter 34.

The third multiplier 33 multiplies the digital measurement signal Sm by the digital demodulation signal of frequency 2·f0. The resulting signal is applied as input to the lowpass filter 34. The second amplifier 35 thus produces a signal that is a digital image of the current Im that is to be measured, which signal is also a digital demagnetization signal Sdm. The digital image signal, or digital demagnetization signal Sdm, is of the form:

$$Sdm = k \cdot Im.$$

It should be observed that the third multiplier 33 and the lowpass filter 34 act as a second synchronous demodulator.

The flux gate current sensor 10 further comprises a summing circuit 36. The summing circuit 36 is implemented in the FPGA.

The summing circuit 36 sums the digital excitation signal Se and the digital demagnetization signal Sdm in order to obtain a digital injection signal Si. This gives:

$$Si = k0 \cdot (k1 \cdot \sin(\omega 0 t) + k2 \cdot \sin(3 \omega 0 t)) + k \cdot Im.$$

The flux gate current sensor 10 further includes an injection circuit 37. The injection circuit 37 forms part of the analog portion 16.

The injection circuit 37 is connected to the summing circuit 36 and to the measurement winding 14.

The injection circuit 37 comprises a digital-to-analog converter (DAC) 38.

In this example, the DAC 38 is a 12-bit converter, and its operation is clocked at the frequency Fech (Fech=100 MHz). The DAC 38 could naturally present characteristics that are different.

The DAC 38 acquires the digital injection signal Si, produces an analog excitation current Ie from the digital injection signal Si, and injects the excitation current Ie into the measurement winding 14.

There follows a description of the operation of the flux gate current sensor 10.

The excitation circuit 23 generates a digital excitation signal Se, which is transformed into an excitation current Ie and injected into the measurement winding 14.

The measurement voltage Ve is acquired and then digitized in order to produce a digital measurement signal Sm.

A signal that is a digital image of the current Im that is to be measured is obtained at the output of the second amplifier 35. This digital image signal is used to estimate the current Im that is to be measured.

The digital image signal is also a digital demagnetization signal Sdm that serves to compensate the magnetic flux produced by the current Im that is to be measured.

By means of the summing circuit 36 and the parallel connection, it is easy to add together the digital demagnetization signal Sdm and the digital excitation signal Se. The excitation current thus serves both to excite the magnetic core 13 and also to demagnetize the magnetic core 13. The demagnetization current is thus incorporated in the excitation current Ie.

Saturation of the magnetic core 13 gives rise to asymmetry in the measurement voltage Ve, said measurement voltage Ve being constituted by the sum of a $\sin(\omega 0 t)$ component of frequency f0, corresponding to the fundamental, and of a $\cos(2\omega 0 t)$ component of frequency 2·f0, corresponding to the second harmonic component.

It should be observed that the amplitudes of the partial digital excitation signal of frequency f0 and of the partial digital excitation signal of frequency 3·f0 are set so as to obtain an excitation current Ie in which the component of frequency 3·f0 (or third harmonic component) is in phase with the component of frequency f0 (or fundamental).

The third harmonic component of the measurement voltage Ve, as obtained after synchronous demodulation using the first synchronous demodulator, is positive. In the event of the magnetic core 13 saturating, the third harmonic component is attenuated more strongly than the fundamental, and, after synchronous demodulation, the third harmonic component becomes negative, since the third harmonic goes into phase opposition with the fundamental.

Thus, when the excitation current Ie is such that the magnetic core 13 approaches saturation, the ratio of the amplitudes of the first harmonic component and of the third harmonic component of the measurement voltage Ve varies until the third harmonic component becomes zero, and then until the phase of the third harmonic component is inverted. The operating point corresponding to the third harmonic component of the measurement voltage Ve becoming zero is thus the optimum operating point for the flux gate current sensor 10. This optimum operating point corresponds to the bend 9 in the FIG. 1 curve plotting the transfer function.

A digital error signal is obtained at the output from the first amplifier 30.

The digital error signal serves to servocontrol the excitation current Ie. The servocontrol consists in controlling the excitation current Ie so as to zero the third harmonic component of the measurement voltage Ve. The flux gate current sensor 10 thus operates continuously on the optimum operating point. This serves to obtain maximum gain of the asymmetries that are introduced by the current Im that is to be measured and that are detectable in the measurement voltage Ve. It should be observed that this servocontrol by synchronously demodulating the third harmonic component is relatively insensitive to external electromagnetic disturbances, since all of the signals of frequency other than the frequency 3·f0 generate intermodulation products having components that are filtered by the lowpass filter 34 connected to the output of the third multiplier 33. It may also be observed that this servocontrol does not need to be very fast, since the variations that come from external parameters (temperature, ageing) are relatively slow.

Thus, the measurement winding 14 is used simultaneously to excite the magnetic core 13, to control the excitation, to measure the current Im that is to be measured, and to compensate the magnetic flux produced in the magnetic core 13 by the current Im that is to be measured (demagnetization).

Combining the functions in a single measurement winding 14 serves to simplify the flux gate current sensor 10, to reduce its cost and weight, and to facilitate its manufacture.

It should also be observed that the system for processing measurement is mainly digital: a single FPGA serves to perform a major portion of this processing system.

Digitizing the processing system increases its reliability and its robustness (in particular in terms of temperature), reduces its cost, facilitates its manufacture, and improves its industrial reproducibility.

The improvement in regulating the operating point that results from the demodulation performed by the first synchronous demodulator also serves to obtain better noise immunity.

Furthermore, the use of synchronous demodulators makes it possible to operate at high frequency, thereby permitting a wide bandwidth for the current Im that is to be measured, while conserving very good immunity to external electromagnetic disturbances.

Since measurement is always performed at the optimum operating point corresponding to the saturation bend 9, the sensitivity of the flux gate current sensor 10 is constant in the temperature range. The accuracy of the flux gate current sensor 10 is thus good over a large temperature range.

As mentioned above, the flux gate current sensor 10 measures a current Im that is to be measured and that flows in a conductor 11.

This situation does not give rise to any particular difficulty when the current Im that is to be measured is small (e.g. less than 1 amp (A)).

Nevertheless, when the current that is to be measured is large, a major difficulty arises.

The demagnetization current, which serves to compensate the magnetic flux produced in the magnetic core 13 by the current Im that is to be measured, must also be very large. The magnitude of the demagnetization current needs to be equal to the magnitude of the current that is to be measured divided by the transformation ratio of the measurement transformer 12, which is associated with the characteristics of the primary winding and of the secondary winding.

However, the number of turns of the measurement winding 14 is limited by its size and by the resulting inductance. The greater the inductance, the more the rate of change of the demagnetization current (coming from the digital demagnetization signal Sdm) is limited, and thus the more the bandwidth of the flux gate current sensor 10 is limited. Thus, increasing the number of turns of the secondary winding is not an effective solution.

Increasing the demagnetization current is not an effective solution either. Specifically, that would involve generating a demagnetization voltage that is very large associated with a demagnetization current that is large, which is difficult to achieve using standard components.

It should be observed that this problem is not specific to the flux gate current sensor 10 as described above, but applies to all flux gate current sensors (and in particular to those that include a winding dedicated to demagnetization only).

In order to solve this difficulty, use is made of a current divider bridge so as to reduce the magnitude of the current that is to be measured.

Figure 5:
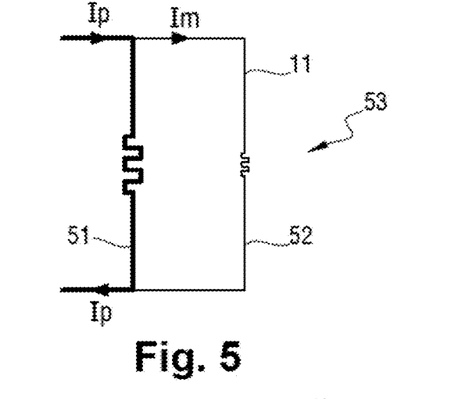
FIG. 5 shows the current divider bridge incorporated in a printed circuit and used for measuring a current that is to be measured.
Figure 6:
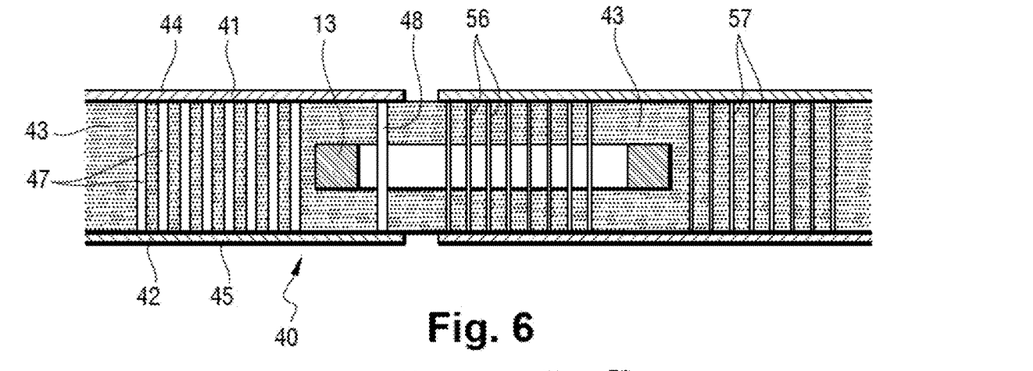
FIG. 6 is a section view of a transformer of the invention used in the novel flux gate current sensor.
Figure 7:
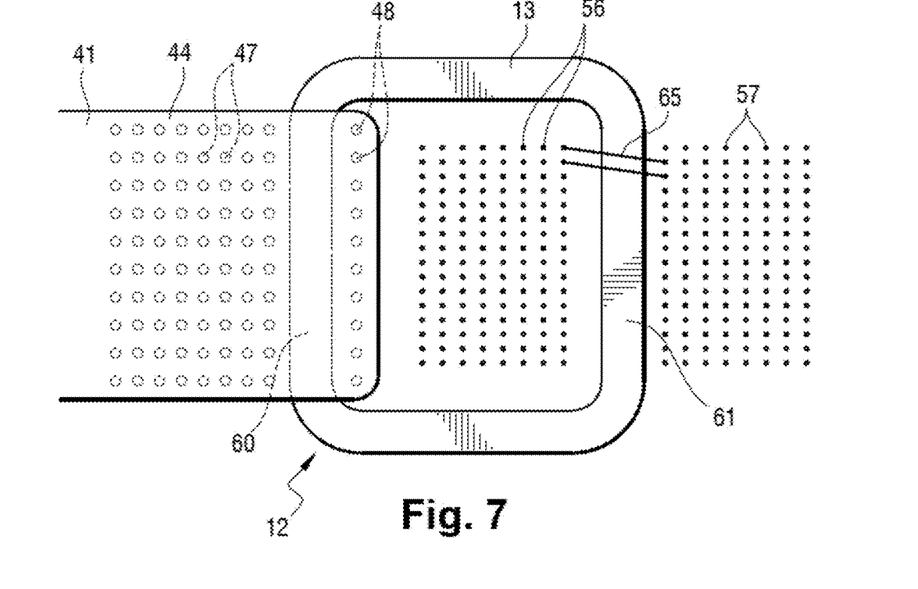
FIG. 7 is a view analogous to the view of FIG. 6, but seen from above.

With reference to FIGS. 5 to 7, the flux gate current sensor 10 comprises a printed circuit 40 having mounted thereon in particular the plurality of electronic components forming the digital portion 15 and the analog portion 16.

In this example, the printed circuit 40 comprises a first conductive layer 41, a second conductive layer 42, and an insulating layer 43. In this example, each of the first conductive layer 41 and the second conductive layer 42 extends over a respective opposite face of the printed circuit 40.

The first conductive layer 41 has a first track 44 and the second conductive layer 42 has a second track 45. The insulating layer 43 thus extends between the first track 44 and the second track 45.

The printed circuit 40 further includes a first through assembly with at least one first primary plated through hole 47 and a second through assembly with at least one second primary plated through hole 48. In this example, and specifically, the first through assembly has a plurality of first primary plated through holes 47 and the second through assembly has a plurality of second primary plated through holes 48. In this example, the first primary plated through holes 47 and the second primary plated through holes 48 all have the same first diameter.

A "plated through hole" may also be referred to as a "via". A "plated through hole" may be made by any type of method. A "plated through hole" may in particular be made conductive by depositing a metal material or any type of conductive material. A "plated through hole" may also be made conductive by inserting a tube or a rivet made of metal or of any type of conductor.

Each first primary plated through hole 47 and each second primary plated through hole 48 connects together the first track 44 and the second track 45 by extending through the insulating layer 43. Each first primary plated through hole 47 thus has a first end connected to the first track 44 and a second end connected to the second track 45. Likewise, each second primary plated through hole 48 thus has a first end connected to the first track and a second end connected to the second track 45.

The first through assembly, i.e. the first primary plated through holes 47, and the second through assembly, i.e. the second primary plated through holes 48, form respectively a first branch 51 and a second branch 52 of a current diviner bridge 53.

Thus, in this example, the current Im that is to be measured is not in reality a main current Ip having a value that is to be determined, but rather the current Im that is to be measured is obtained by dividing the main current Ip and it is then used for estimating the value of the main current Ip. The main current Ip flows in the first track 44, in the first and second branches 51 and 52 of the current divider bridge 53, and in the second track 45.

In this example, it can thus clearly be seen that the above-mentioned conductor 11 conveying the current that is to be measured is constituted by the second through assembly (or the second branch 52).

In this example, the main current Ip is equal to 10 A.

The number of first primary plated through holes 47 in the first through assembly is nine times greater than the number of second primary plated through holes 48 in the second through assembly. The second resistance of the second branch 52 is thus nine times greater than the first resistance of the first branch 51.

The current Im that is to be measured, flowing in the second branch 52 of the current divider bridge 53, is equal to 1 A, while the current flowing in the first branch 51 of the current divider bridge 53 is equal to 9 A.

In this example, advantage is taken of the reproducibility properties of the electrical characteristics of a plurality of same-diameter plated through holes that are adjacent in the same printed circuit 40.

The first resistance of the first branch 51 and the second resistance of the second branch 52 are not accurately known, but because of this reproducibility, their ratio is known very accurately.

The first through assembly and the second through assembly are thus equivalent to two shunt resistors of well-controlled ratio.

The ratio between the current Im that is to be measured and the main current Ip is thus known very accurately. Measuring the current Im that is to be measured enables the main current Ip to be estimated very accurately, while reducing it in order to reduce the demagnetization current that is required.

The current Im that is to be measured is measured by using the measurement transformer 12 of the invention, which is described below in greater detail.

The measurement transformer 12 of the invention includes the printed circuit 40, or more precisely, it includes a portion of the printed circuit 40, given that the printed circuit also carries the digital portion 15 and the analog portion 16.

Together, the above-described first and second through assemblies form a "primary through assembly". The primary through assembly thus comprises the first primary plated through holes 47 and the second primary plated through holes 48. The printed circuit 40 also includes a third through assembly comprising at least one first secondary plated through hole 56 extending through the insulating layer 43, and a fourth through assembly comprising at least one second secondary plated through hole 57 extending through the insulating layer 43. In this example, and specifically, the third through assembly comprises a plurality of first secondary plated through holes 56 and the fourth through assembly comprises a plurality of second secondary plated through holes 57. In this example, the first secondary plated through holes 56 and the second secondary plated through holes 57 all have the same second diameter that, for reasons of available space, is smaller than the first diameter of the first primary plated through holes 47 and of the second primary plated through holes 48. The number of first secondary plated through holes 56 is equal to the number of second secondary plated through holes 57.

The third and fourth through assemblies together form an assembly that is referred to herein as the "secondary through assembly".

The measurement transformer 12 also includes the magnetic core 13. The magnetic core 13 extends in the thickness of the printed circuit 40.

The magnetic core 13 is in the shape of a tube having inside and outside sections that are rectangular. It should be observed that the magnetic core 13 could naturally have a shape that is different. The magnetic core 13 includes a primary core portion 60 and a secondary core portion 61. The first primary plated through holes 47 extend outside the magnetic core 13, in the proximity of the primary core portion 60. The second primary plated through holes 48 extend inside the magnetic core 13, in the proximity of the primary core portion 60.

The primary through assembly thus forms part of a primary winding of the measurement transformer 12, said primary winding having only one turn in this example.

The first secondary plated through holes 56 extend inside the magnetic core 13, in the proximity of the secondary core portion 61. The second secondary plated through holes 57 extend outside the magnetic core 13, in the proximity of the secondary core portion 61.

It can be seen that the first secondary plated through holes 56 and the second secondary plated through holes 57 are connected together by conductive elements 65 (by way of example, but not necessarily, tracks) that extend in the first conductive layer 41 and in the second conductive layer 42. Only two conductive elements 65 are shown in FIG. 7.

The third through assembly thus forms a first portion of the secondary winding of the measurement transformer 12. The fourth through assembly thus forms a second portion of the secondary winding of the measurement transformer 12. The secondary through assembly thus forms a portion of the secondary winding of the measurement transformer 12.

The secondary winding has a plurality of turns connected in series, each turn comprising a first secondary plated through hole 56, a second secondary plated through hole 57, and a conductor element 65.

It can thus be seen that the secondary winding of the measurement transformer 12 is the above-mentioned measurement winding 14.

The measurement transformer 12 of the invention is very advantageous.

The currents flowing in the first primary plated through holes 47 and in the second primary plated through holes 48 produce opposing magnetic fluxes.

The flux difference produced by the different numbers of plated through holes generates the resulting flux that is actually received by the magnetic core 13. It is this resulting flux that is used for measuring the current Im that is to be measured. The current Im that is to be measured is accurately determined by the ratio between the number of first primary plated through holes 47 and the number of second primary plated through holes 48, thus enabling an accurate current diviner to be made at very low cost.

Thus, unlike any "conventional" transformer of the prior art, which is designed to convey as much energy as possible via a volume and a weight that are as small as possible, the measurement transformer 12 makes it possible to obtain saturation with a magnetic field that is very small. Under such conditions, the size of the magnetic core 13 can be smaller, particularly since the flux in the core is minimized by a demagnetization flux opposite to the flux that is generated by the current Im that is to be measured.

There follows a description of how the printed circuit 40 and the magnetic core 13 that extends in the thickness of the printed circuit 40 are manufactured.

The printed circuit 40 includes a first prepreg layer and a second prepreg layer (where "prepreg" is short for "pre-impregnated"). The first and second prepreg layers are not polymerized.

The magnetic core 13 comprises a mixture of a magnetic powder and a resin that constitutes a binder for the magnetic powder.

The magnetic powder is made from a crystal structure, specifically yttrium iron garnet ($Y_3Fe_{15}O_{12}$).

The resin is an epoxy resin.

The magnetic core 13 is deposited on the first prepreg layer by silkscreen printing.

Thereafter, the magnetic core 13 is covered by the second prepreg layer.

The printed circuit 40 is then passed through an oven.

The printed circuit 40 is then drilled in order to make the above-described plated through holes.

Alternatively, the magnetic core 13 can be manufactured by laser sintering using an additive manufacturing technology.

The magnetic powder is deposited on a first prepreg layer. Thereafter, a laser beam is used to agglomerate the magnetic powder layer in predefined zones so as to form the magnetic core 13.

The magnetic core 13 is then covered by the second prepreg layer layer.

Manufacturing the magnetic core 13 by laser sintering appears to be more effective. Specifically, when manufacturing by silkscreen printing, it is observed that in the mixture of magnetic powder and resin there are to be found as many air gaps as there are particles of magnetic powder. These air gaps reduce the performance of the magnetic core 13. With laser sintering, the particles of the magnetic powder are melted, which avoids creating said air gaps.

Naturally, the invention is not limited to the embodiment described, but covers any variant coming within the ambit of the invention as defined by the claims.

It is stated that the flux gate current sensor comprises a digital portion and an analog portion, and that the ADC and the DAC form parts of the analog portion. Naturally, it could be considered that these components are digital components, and even that they are incorporated directly in the FPGA (or in a microcontroller or in some other component), in which case they would form parts of the digital portion.

It is stated above that each of the first conductive layer comprising the first track and the second conductive layer comprising the second track extends over a respective opposite face of the printed circuit. Naturally, the first conductive layer and the second conductive layer could be internal layers of the printed circuit, separated by one or more insulating layers.

Above, each of the through assemblies is described as comprising one or more plated through holes. Above, the plated through holes all pass through a single insulating layer. Naturally, the plated through holes could pass through a plurality of insulating layers, or even through one or more insulating layers and one or more conductive layers. Distinct through assemblies could equally well pass through distinct stacks of layers.

Naturally, the transformer of the invention may be used in any type of application that requires a transformer: the invention is not limited in any way to flux gate current sensors.

The invention claimed is:

1. A measurement transformer comprising:
   a printed circuit comprising:
      an insulating layer,
      a primary winding comprising a primary through assembly comprising first primary plated through holes and second primary plated through holes extending through the insulating layer, said primary winding having a single turn; and a secondary winding comprising a secondary through assembly comprising first secondary plated through holes and second secondary plated through holes extending through the insulating layer, said secondary winding comprising a plurality of turns connected in series, and a magnetic core extending in a thickness of the printed circuit.

2. The measurement transformer according to claim 1, wherein each of the first and second primary plated through holes has a first end connected to a common first track of a first conductive layer of the printed circuit and a second end connected to a common second track of a second conductive layer of the printed circuit.

3. The measurement transformer according to claim 1, wherein the first primary plated through holes and the second primary plated through holes form respectively a first branch and a second branch of a current divider bridge, the measurement transformer being arranged to measure a current that is to be measured flowing in the second branch and obtained by dividing a main current flowing in the first branch.

4. The measurement transformer according to claim 1, wherein the core comprises a primary core portion and a secondary core portion, the first primary plated through holes extending outside the core in the proximity of the primary core portion and the second primary plated through holes extending inside the core in the proximity of the primary core portion, the first secondary plated through holes extending inside the core in the proximity of the secondary core portion and the second secondary plated through holes extending outside the core in the proximity of the secondary core portion.

5. The measurement transformer according to claim 1, wherein the magnetic core comprises a magnetic powder.

6. The measurement transformer according to claim 4, the magnetic core comprising a mixture of the magnetic powder and of a resin and being deposited on a layer of the printed circuit by silkscreen printing.

7. The measurement transformer according to claim 4, the magnetic core being made by laser sintering magnetic powder deposited on a layer of the printed circuit.

8. The measurement transformer according to claim 4, wherein the magnetic powder comprises yttrium iron garnet.

* * * * *